(12) United States Patent
Yoneda et al.

(10) Patent No.: US 10,658,629 B2
(45) Date of Patent: May 19, 2020

(54) ORGANIC ELECTROLUMINESCENT ELEMENT, ORGANIC ELECTROLUMINESCENT PANEL, ORGANIC ELECTROLUMINESCENT DEVICE AND ELECTRONIC APPARATUS

(71) Applicant: JOLED INC., Tokyo (JP)

(72) Inventors: Kazuhiro Yoneda, Tokyo (JP); Noriyuki Matsusue, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/003,287

(22) Filed: Jun. 8, 2018

(65) Prior Publication Data
US 2018/0358585 A1 Dec. 13, 2018

(30) Foreign Application Priority Data
Jun. 12, 2017 (JP) .................. 2017-115131

(51) Int. Cl.
| H01L 51/56 | (2006.01) |
| H01L 51/52 | (2006.01) |
| H01L 51/50 | (2006.01) |
| H01L 27/32 | (2006.01) |
| H01L 51/00 | (2006.01) |
| G09G 3/3233 | (2016.01) |

(52) U.S. Cl.
CPC .......... *H01L 51/56* (2013.01); *H01L 27/3246* (2013.01); *H01L 51/504* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/524* (2013.01); *H01L 51/5206* (2013.01); *H01L 51/5221* (2013.01); *G09G 3/3233* (2013.01); *G09G 2300/0452* (2013.01); *H01L 27/3211* (2013.01); *H01L 51/0003* (2013.01); *H01L 51/0008* (2013.01)

(58) Field of Classification Search
CPC ............ H01L 51/56; H01L 2251/5338; H01L 51/0072; H01L 51/5016; H01L 51/0097
USPC .......................................................... 257/40
See application file for complete search history.

(56) References Cited

U.S. PATENT DOCUMENTS

| 2006/0115681 | A1* | 6/2006 | Kambe ................ H01L 51/004 428/690 |
| 2013/0181205 | A1* | 7/2013 | Mima ................. H01L 51/0005 257/40 |
| 2013/0234121 | A1* | 9/2013 | Sonoyama .......... H01L 51/5012 257/40 |
| 2014/0326975 | A1* | 11/2014 | Tsurutani ............. H05B 33/145 257/40 |
| 2016/0276602 | A1 | 9/2016 | Yoshinaga et al. |
| 2017/0104171 | A1* | 4/2017 | Chen ..................... H01L 51/56 |

FOREIGN PATENT DOCUMENTS

WO  2014/076917 A1  5/2014

* cited by examiner

Primary Examiner — Andy Huynh
(74) Attorney, Agent, or Firm — Chip Law Group

(57) ABSTRACT

Disclosed is an organic electroluminescent element including a first electrode, a hole transport layer, a light emitting layer, an electron transport layer and a second electrode in this order. The light emitting layer has a first light emitting layer including a coating film on the hole transport layer side, and has a second light emitting layer including a vapor-deposited film on the electron transport layer side.

8 Claims, 6 Drawing Sheets

ORGANIC ELECTROLUMINESCENT ELEMENT, ORGANIC ELECTROLUMINESCENT PANEL, ORGANIC ELECTROLUMINESCENT DEVICE AND ELECTRONIC APPARATUS

CROSS-REFERENCE TO RELATED APPLICATION

This application claims priority benefit of Japanese Patent Application No. JP 2017-115131 filed in the Japan Patent Office on Jun. 12, 2017. Each of the above-referenced applications is hereby incorporated herein by reference in its entirety.

BACKGROUND

The present disclosure relates to an organic electroluminescent element, an organic electroluminescent panel, an organic electroluminescent device and an electronic apparatus.

As an organic electroluminescent device (organic electroluminescent display) that uses organic electroluminescent elements, there have been proposed various ones (see, for example, WO 2014/076917).

SUMMARY

Meanwhile, in the organic electroluminescent device, it is desired to improve light emission efficiency of the organic electroluminescent elements. Therefore, it is desirable to provide an organic electroluminescent element in which light emission efficiency can be improved, and an organic electroluminescent panel, an organic electroluminescent device and an electronic apparatus using the same.

According to one embodiment of the present disclosure, there is provided an organic electroluminescent element that has a first electrode, a hole transport layer, a light emitting layer, an electron transport layer and a second electrode in this order. The light emitting layer has a first light emitting layer including a coating film on the hole transport layer side, and has a second light emitting layer including a vapor-deposited film on the electron transport layer side.

According to one embodiment of the present disclosure, there is provided an organic electroluminescent panel that has a plurality of pixels. Each of the pixels has a plurality of sub-pixels, and each of the sub-pixels has an organic electroluminescent element. In at least one of the sub-pixels in each of the pixels, the organic electroluminescent element has the same constituent elements as those of the above-mentioned organic electroluminescent element.

According to one embodiment of the present disclosure, there is provided an organic electroluminescent device that includes an organic electroluminescent panel having a plurality of pixels, and a driving section adapted to drive the plurality of pixels. The organic electroluminescent panel has the same constituent elements as those of the organic electroluminescent panel. According to one embodiment of the present disclosure, there is provided an electronic apparatus that has the above-mentioned organic electroluminescent device.

In accordance with the organic electroluminescent element, the organic electroluminescent panel, the organic electroluminescent device and the electronic apparatus according to embodiments of the present disclosure, the light emitting layer has the first light emitting layer including a coating film on the hole transport layer side, and has the second light emitting layer including a vapor-deposited film on the electron transport layer side; therefore, light emission efficiency of the organic electroluminescent element can be improved. Note that the above-mentioned contents constitute merely an example of the present disclosure. The effects of the present disclosure are not limited to the above-mentioned, may be any other effect, and may further include other effects.

DETAILED DESCRIPTION OF THE PREFERRED EMBODIMENTS

Figure 1:
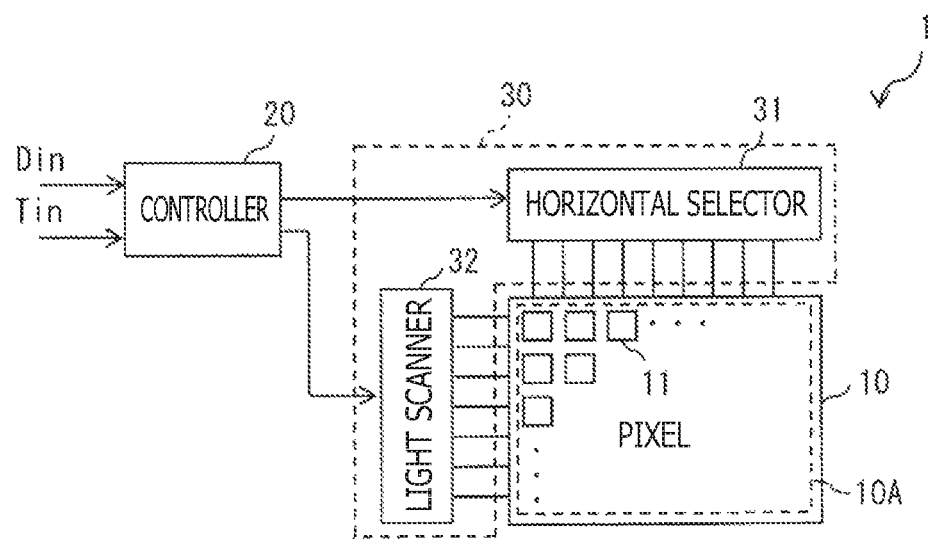
FIG. 1 is a diagram depicting an example of general configuration of an organic electroluminescent device according to one embodiment of the present disclosure.

Modes for carrying out the present disclosure will be described below, referring to the drawings. All the embodiments described below represent specific preferred examples of the present disclosure. Therefore, numerical values, shapes, materials, constituent elements, layout positions and connection forms of the constituent elements and the like are mere examples and are not to be construed as limiting the present disclosure. Accordingly, of the constituent elements in the following embodiments, those which are not described in independent claims indicating the broadest concept of the present disclosure will be described as arbitrary constituent elements. Note that the drawings are schematic figures, and are not necessarily strict illustrations. In addition, in the drawings, those configurations which are substantially the same are denoted by the same reference symbols, and overlapping descriptions thereof will be omitted or simplified. Note that the descriptions will be made in the following order.

1. Embodiment (Organic electroluminescent device)
2. Modifications (Organic electroluminescent device)

3. Application examples (Electronic apparatus, Illumination apparatus)

1. Embodiment

Configuration

Figure 2:
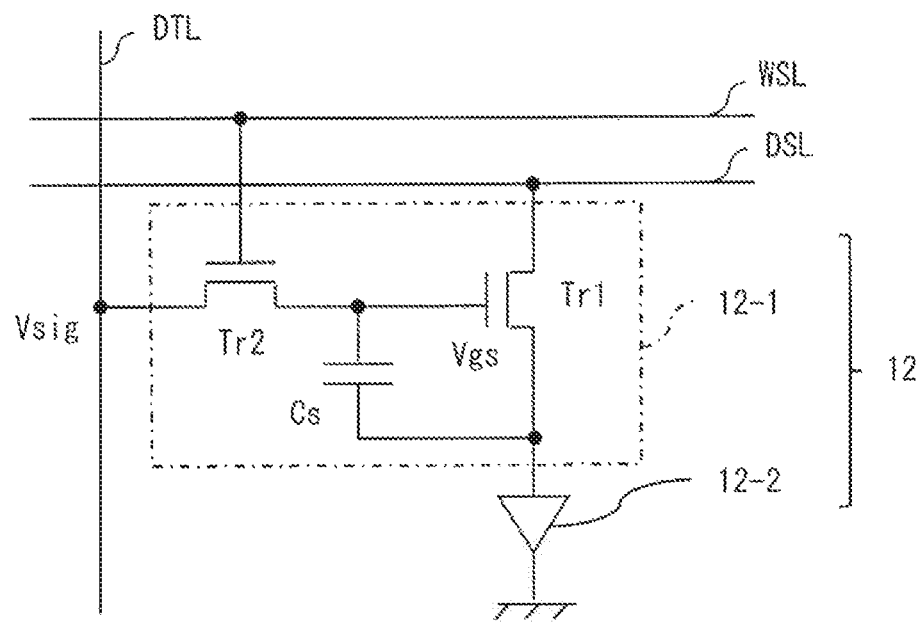
FIG. 2 is a diagram depicting an example of circuit configuration of a pixel depicted in FIG. 1.

FIG. 1 depicts an example of general configuration of an organic electroluminescent device 1 according to one embodiment of the present disclosure. FIG. 2 depicts an example of circuit configuration of a sub-pixel 12 included in each pixel 11 provided in the organic electroluminescent device 1. The organic electroluminescent device 1 includes an organic electroluminescent panel 10, a controller 20 and a driver 30, for example. The driver 30 is mounted, for example, to an outer edge portion of the organic electroluminescent panel 10. The organic electroluminescent panel 10 has a plurality of pixels 11 arranged in a matrix pattern in a pixel region 10A. The controller 20 and the driver 30 drive the organic electroluminescent panel 10 (the plurality of pixels 11), based on a video signal Din and a synchronizing signal Tin which are inputted from outside.

<Organic Electroluminescent Panel 10>

The organic electroluminescent panel 10, with the pixels 11 driven by active matrix driving by the controller 20 and the driver 30, displays an image based on the video signal Din and the synchronizing signal Tin which are inputted from the outside. The organic electroluminescent panel 10 includes a plurality of scanning lines WSL extending in a row direction, a plurality of signal lines DTL and a plurality of power supply lines DSL extending in a column direction, and the plurality of pixels 11 arranged in a matrix pattern.

The scanning lines WSL, which are used for selection of the pixels 11, supply the pixels 11 with selection signals for selecting the pixels 11 on the basis of a predetermined unit (for example, pixel row). The signal lines DTL, which are used for supplying the pixels 11 with signal voltages Vsig according to the video signal Din, supply the pixels 11 with data pulses including the signal voltages Vsig. The power supply lines DSL are for supplying the pixels 11 with electric power.

Each of the pixels 11 is configured to include a sub-pixel 12 adapted to emit red light, a sub-pixel 12 adapted to emit green light, and a sub-pixel 12 adapted to emit blue light, for example. Note that each pixel 11 may further include a sub-pixel or sub-pixels 12 adapted to emit other color or colors (for example, white, yellow or the like), for example. In each pixel 11, the plurality of sub-pixels 12 are arranged in a row in a predetermined direction, for example.

Each signal line DTL is connected to an output end of a horizontal selector 31 which will be described later. The plurality of signal lines DTL are allocated, one to each pixel column, for example. Each scanning line WSL is connected to an output end of a light scanner 32 which will be described later. The plurality of scanning lines WSL are allocated, one to each pixel row, for example. Each power supply line DSL is connected to an output end of a power supply. The plurality of power supply lines DSL are allocated, one to each pixel row, for example.

Each sub-pixel 12 has a pixel circuit 12-1 and an organic electroluminescent element 12-2. The configuration of the organic electroluminescent element 12-2 will be described in detail later.

The pixel circuit 12-1 controls light emission and quenching of the organic electroluminescent element 12-2. The pixel circuit 12-1 has a function of holding a voltage written to each sub-pixel 12 by write scanning which will be described later. The pixel circuit 12-1 is configured to include a drive transistor Tr1, a write transistor Tr2 and a holding capacitor Cs.

The write transistor Tr2 controls application of the signal voltage Vsig corresponding to the video signal Din to a gate of the drive transistor Tr1. Specifically, the write transistor Tr2 samples the voltage of the signal line DTL, and writes the voltage obtained by the sampling to the gate of the drive transistor Tr1. The drive transistor Tr1 is connected in series to the organic electroluminescent element 12-2. The drive transistor Tr1 drives the organic electroluminescent element 12-2. The drive transistor Tr1 controls a current flowing in the organic electroluminescent element 12-2 according to the magnitude of the voltage sampled by the write transistor Tr2. The holding capacitor Cs is for holding a predetermined voltage between a gate and a source of the drive transistor Tr1. The holding capacitor Cs has a role of keeping constant a gate-source voltage Vgs of the drive transistor Tr1 during a predetermined period. Note that the pixel circuit 12-1 may have a circuit configuration in which various capacitors and/or transistors are added to the above-mentioned two-transistors-and-one-capacitor circuit, or may have a circuit configuration different from that of the above-mentioned two-transistors-and-one-capacitor circuit.

Each signal line DTL is connected to an output end of the horizontal selector 31 which will be described later and to a source or a drain of the write transistor Tr2. Each scanning line WSL is connected to an output end of the light scanner 32 which will be described later and to a gate of the write transistor Tr2. Each power supply line DSL is connected to a power supply circuit and to a source or a drain of the drive transistor Tr1.

The gate of the write transistor Tr2 is connected to the scanning line WSL. The source or the drain of the write transistor Tr2 is connected to the signal line DTL. That one of the source and the drain of the write transistor Tr2 which is not connected to the signal line DTL is connected to the gate of the drive transistor Tr1. The source or the drain of the drive transistor Tr1 is connected to the power supply line DSL. That one of the source and the drain of the drive transistor Tr1 which is not connected to the power supply line DSL is connected to an anode 21 of the organic electroluminescent element 12-2. One end of the holding capacitor Cs is connected to the gate of the drive transistor Tr1. The other end of the holding capacitor Cs is connected to that one of the source and the drain of the drive transistor Tr1 which is on the side of the organic electroluminescent element 12-2.

<Driver 30>

The driver 30 has the horizontal selector 31 and the light scanner 32, for example. The horizontal selector 31 applies the analog signal voltage Vsig, which is inputted from the controller 20, to each signal line DTL, according to (synchronously with) inputting of a control signal, for example. The light scanner 32 scans the plurality of sub-pixels 12 on the basis of a predetermined unit.

<Controller 20>

The controller 20 will be described below. The controller 20, for example, applies a predetermined correction to the digital video signal Din inputted from outside, and, based on a video signal obtained by the correction, produces the signal voltage Vsig. The controller 20, for example, outputs the thus produced signal voltage Vsig to the horizontal selector 31. The controller 20 outputs the control signal to each circuit in the driver 30, according to (synchronously with) the synchronizing signal Tin inputted from outside, for example.

Figure 3:
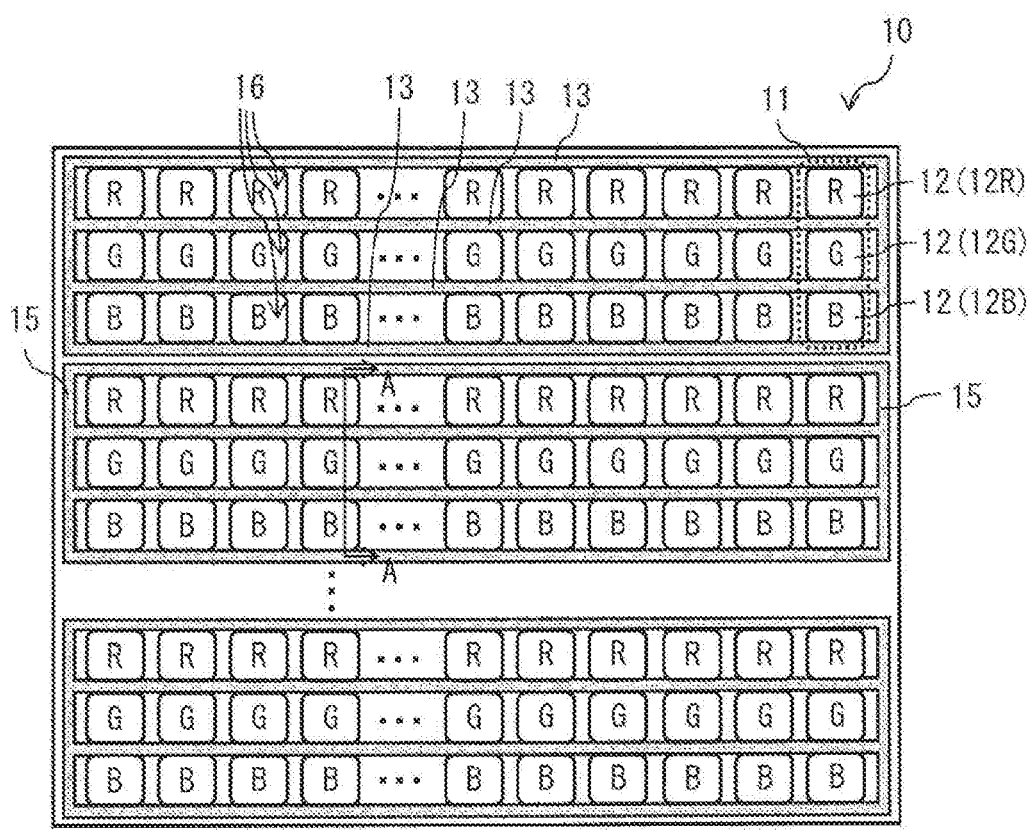
FIG. 3 illustrates an example of general configuration of an organic electroluminescent panel depicted in FIG. 1.
Figure 4:
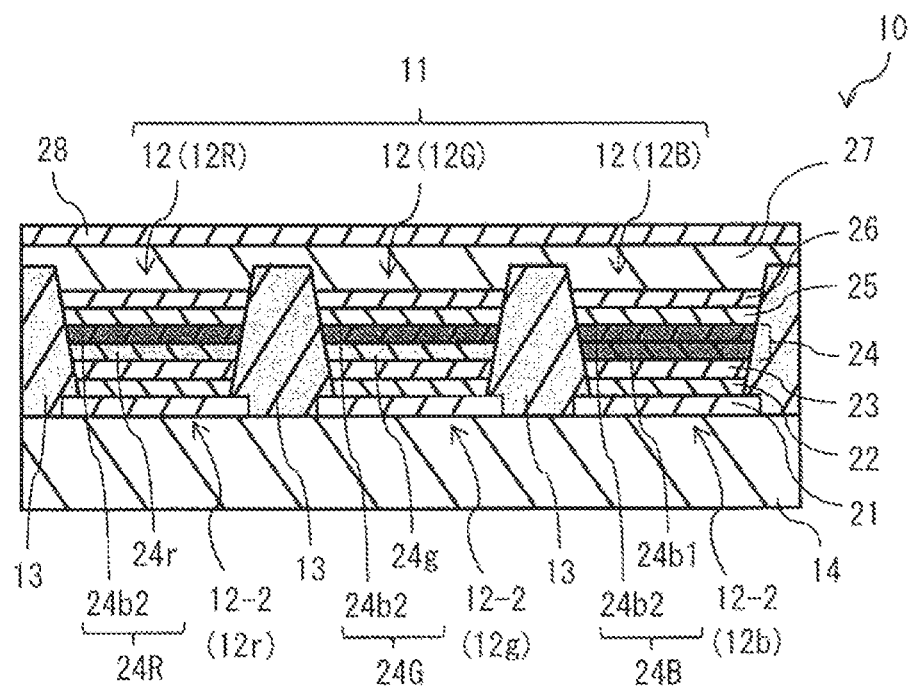
FIG. 4 depicts an example of sectional configuration of the organic electroluminescent panel along line A-A of FIG. 3.

Referring to FIGS. 3 and 4, the organic electroluminescent element 12-2 will be described below. FIG. 3 depicts an example of general configuration of the organic electroluminescent panel 10. FIG. 4 depicts an example of sectional configuration of the organic electroluminescent panel 10 along line A-A of FIG. 3.

The organic electroluminescent panel 10 has the plurality of pixels 11 arranged in a matrix pattern. As for example aforementioned, each pixel 11 is configured to include the sub-pixel 12 (12R) adapted to emit red light, the sub-pixel 12 (12G) adapted to emit green light, and the sub-pixel 12 (12B) adapted to emit blue light. The sub-pixel 12R is configured to include an organic electroluminescent element 12-2 (12r) adapted to emit red light. The sub-pixel 12G is configured to include an organic electroluminescent element 12-2 (12g) adapted to emit green light. The sub-pixel 12B is configured to include an organic electroluminescent element 12-2 (12b) adapted to emit blue light. The sub-pixels 12R, 12G and 12B are in a stripe arrangement, for example. In each pixel 11, the sub-pixels 12R, 12G and 12B are disposed in the state of being aligned in the column direction, for example. Further, in each pixel row, a plurality of sub-pixels 12 adapted to emit the same color light are arranged in a row in the row direction, for example.

The organic electroluminescent panel 10 has a plurality of line banks 13 extending in the row direction and a plurality of banks 15 extending in the column direction, on a substrate 14. The plurality of line banks 13 and the plurality of banks 15 partition the pixel region 10A. The plurality of line banks 13 partition the sub-pixel 12 in each pixel 11. The plurality of banks 15 partition the pixels 11 in each pixel row. In other words, the plurality of sub-pixels 12 are partitioned by the plurality of line banks 13 and the plurality of banks 15. Each bank 15 is provided between two line banks 13 adjacent to each other in the column direction. Both end portions of each bank 15 are connected to two line banks 13 adjacent to each other in the column direction.

The substrate 14 includes, for example, a base material adapted to support the organic electroluminescent elements 12-2, the line banks 13, the banks 15 and the like, and a wiring layer provided on the base material. The base material in the substrate 14 includes, for example, a glass substrate, a flexible substrate or the like. Examples of the material of the glass substrate used as the base material in the substrate 14 include no alkali glass, soda glass, nonfluorescent glass, phosphate glass, borate glass, and quartz. Examples of the material of the flexible substrate used as the base material of the substrate 14 include acrylic resins, styrene resins, polycarbonate resins, epoxy resins, polyethylene, polyesters, and silicone resins. The wiring layer in the substrate 14 is formed, for example, with the pixel circuits 12-1 of the pixels 11. The substrate 14 is in contact with bottom surfaces of the plurality of banks 15, and supports the plurality of banks 15.

The line banks 13 and the banks 15 are configured to include an insulating organic material, for example. Examples of the insulating organic material include acrylic resins, polyimide resins and novolak type phenolic resins. The line banks 13 and the banks 15 are preferably formed from an insulating resin having heat resistance and solvent resistance, for example. The line banks 13 and the banks 15 are formed, for example, by processing an insulating resin into a desired pattern by photolithography and development. The sectional shape of the line bank 13 may be, for example, a normally tapered shape as depicted in FIG. 4, or may be a reversely tapered shape narrower on the lower side.

A region surrounded by two line banks 13 parallel and adjacent to each other and the banks 15 at both ends is a groove portion 16. Further, a region surrounded by the two line banks 13 parallel and adjacent to each other and two banks 15 parallel and adjacent to each other corresponds to the sub-pixel 12. In other words, the organic electroluminescent elements 12-2 are disposed, one in each region that is surrounded by the two line banks 13 parallel and adjacent to each other and the two banks 15 parallel and adjacent to each other.

Each organic electroluminescent element 12-2 includes, for example, an anode 21, a hole injection layer 22, a hole transport layer 23, a light emitting layer 24, an electron transport layer 25, an electron injection layer 26 and a cathode 27, in this order from the substrate 14 side. The hole injection layer 22 is a layer for enhancing hole injection efficiency. The hole transport layer 23 is a layer for transporting holes, injected from the anode 21, to the light emitting layer 24. The light emitting layer 24 is a layer for emitting light in a predetermined color through recombination of electrons and holes. The electron transport layer 25 is a layer for transporting electrons, injected from the cathode 27, to the light emitting layer 24. The electron injection layer 26 is a layer for enhancing electron injection efficiency. At least one of the hole injection layer 22 and the electron injection layer 26 may be omitted. Each organic electroluminescent element 12-2 may further have other layers than the above-mentioned.

The anode 21 is formed on the substrate 14, for example. Further, the anode 21 is formed, for example, in such a manner that end edges of the anode 21 are embedded in the line banks 13 and the banks 15. Therefore, the end edges of the anode 21 are located beneath the line bank 13 and the bank 15. In each sub-pixel row, the plurality of anodes 21 are disposed at regular intervals in the extending direction of the groove portion 16, for example. The banks 15 are disposed, one between the two anodes 21 adjacent to each other in the extending direction of the groove portion 16. The anode 21 is a transparent electrode having a light transmitting property; for example, a transparent conductive film formed of a transparent conductive material such as ITO (Indium Tin Oxide) or IZO (Indium Zinc Oxide) is used therefor. Note that the anode 21 is not limited to a transparent electrode, and may be, for example, an electrode made of aluminum (Al), silver (Ag), an alloy of aluminum or silver, or the like, or may be a reflective electrode having a reflecting property. The anode 21 may be a laminate of a reflective electrode and a transparent electrode.

The hole transport layer 23 has a function of transporting the holes, injected from the anode 21, to the light emitting layer 24. The hole transport layer 23 is a coating layer, for example. The hole transport layer 23 is formed, for example, by applying a solution containing an organic material having a hole transporting property (hereinafter referred to as "hole transporting material 23M") as a main constituent of solutes, and drying the applied solution. The hole transport layer 23 is configured to contain the hole transporting material 23M as a main constituent.

The hole transporting material 23M as the raw material (material) for the hole transport layer 23 is, for example, an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene derivative, a polystyrene derivative, a triphenylmethane derivative, a tetraphenylbenzene derivative, or the like, or a combined material thereof. The hole transporting material 23M further has a soluble group and an insolubilizing group such as a thermal dissociation soluble group, a crosslinking group or a leaving protective group, in its molecule, for dissolving and insolubilizing functions, for example. In this case, the hole transport layer 23 includes a coating film having been subjected to an insolubilizing treatment.

The electron transport layer 25 has a function of transporting the electrons, injected from the cathode 27, to the light emitting layer 24. The electron transport layer 25 is a vapor-deposited layer, for example. The electron transport layer 25 is configured to contain an organic material having an electron transporting property (hereinafter referred to as "electron transporting material 25M").

The electron transport layer 25 is interposed between the light emitting layer 24 and the cathode 27, and has a function of transporting the electrons, injected from the cathode 27, to the light emitting layer 24. The electron transporting material 25M as the raw material (material) for the electron transport layer 25 is, for example, an aromatic heterocyclic compound having at least one hetero-atom in its molecule. Examples of the aromatic heterocyclic compound include compounds including a pyridine ring, a pyrimidine ring, a triazine ring, a benzimidazole ring, a phenanthroline ring, a quinazoline ring or the like in a skeleton thereof. In addition, the electron transport layer 25 may contain a metal having an electron transporting property. Where the electron transport layer 25 contains a metal having an electron transporting property, the electron transporting property of the electron transport layer 25 can be enhanced thereby. As the metal to be contained in the electron transport layer 25, there can be used, for example, barium (B), lithium (Li), calcium (Ca), potassium (K), cesium (Cs), sodium (Na), rubidium (Rb), yttrium (Y), and the like.

The cathode 27 is, for example, a reflective electrode having a light reflecting property, and is, for example, a metallic electrode formed by use of a metallic material having a reflecting property. As the material for the cathode 27, there is used, for example, aluminum (Al), magnesium (Mg), silver (Ag), an aluminum-lithium alloy, a magnesium-silver alloy, or the like. Note that the cathode 27 is not limited to the reflective electrode, and may be a transparent electrode such as an ITO film, like the anode 21. In the case where the substrate 14 and the anode 21 have a light transmitting property whereas the cathode 27 has a reflecting property, the organic electroluminescent element 12-2 has a bottom emission structure for emitting light from the substrate 14 side. In the case where the anode 21 has a reflecting property whereas the cathode 27 has a light transmitting property, the organic electroluminescent element 12-2 has a top emission structure.

The organic electroluminescent panel 10 may further have, for example, a sealing layer 28 for sealing each organic electroluminescent element 12-2. The sealing layer 28 is provided, for example, in contact with a surface of the cathode 27 of each organic electroluminescent element 12-2.

The light emitting layer 24 will be described below on the basis of the sub-pixel 12.

In the sub-pixel 12B adapted to emit blue light, the light emitting layer 24 (24B) has a light emitting layer 24b1 (first light emitting layer) including a coating film on the hole transport layer 23 side, and has a light emitting layer 24b2 (second light emitting layer) including a vapor-deposited film on the electron transport layer 25 side, as depicted in FIG. 4, for example. The light emitting layer 24b2 is formed on a surface of the light emitting layer 24b1.

The light emitting layer 24b2 has a function of emitting blue light through recombination of holes and electrons. The light emitting layer 24b is configured to contain as a main constituent an organic material which produces excitons through recombination of holes and electrons and emits light (hereinafter referred to as "organic light emitting material 24Mb"). In the organic electroluminescent element 12b included in the sub-pixel 12B, the organic light emitting material 24Mb is configured to contain a blue organic light emitting material. The organic light emitting material 24Mb as the raw material (material) for the light emitting layer 24b2 contains a host material and a dopant material. The host material is mainly in charge of the function of transporting electric charges of electrons or holes, while the dopant material is in charge of the function of emitting light. The host material and the dopant material contained in the organic light emitting material 24Mb are each not limited to one kind of material, and may each be a combination of two or more kinds of materials.

The light emitting layer 24b1 is configured, for example, to contain the organic light emitting material 24Mb as a main constituent. In this instance, the light emitting layer 24b1 and the light emitting layer 24b2 contain a common host material and a common dopant material. Note that the light emitting layer 24b1 may not contain the dopant material, and may contain the host material which is common to the light emitting layer 24b1 and the light emitting layer 24b2.

In the sub-pixel 12R adapted to emit red light, the light emitting layer 24 (24R) has a light emitting layer 24r including a coating film on the hole transport layer 23 side, and has a light emitting layer 24b2 including a vapor-deposited film on the electron transport layer 25 side, as depicted in FIG. 4, for example. The light emitting layer 24b2 is formed on a surface of the light emitting layer 24r.

The light emitting layer 24r has a function of emitting red light through recombination of holes and electrons. The light emitting layer 24r is configured to contain as a main constituent an organic material which produces excitons through recombination of holes and electrons and emits light (hereinafter referred to as "organic light emitting material 24Mr"). In the organic electroluminescent element 12r included in the sub-pixel 12R, the organic light emitting material 24Mr is configured to contain a red organic light emitting material. The organic light emitting material 24Mr as the raw material (material) for the light emitting layer 24r contains a host material and a dopant material. The host material is in charge of the function of transporting electric charges of electrons or holes, while the dopant material is in charge of the function of emitting light. The host material and the dopant material contained in the organic light emitting material 24Mr are each not limited to one kind of material, and may each be a combination of two or more kinds of materials.

In the sub-pixel 12G adapted to emit green light, as depicted in FIG. 4, the light emitting layer 24 (24G) has a light emitting layer 24g including a coating film on the hole transport layer 23 side, and has a light emitting layer 24b2 including a vapor-deposited film on the electron transport layer 25 side. The light emitting layer 24b2 is formed on a surface of the light emitting layer 24g.

The light emitting layer 24g has a function of emitting green light through recombination of holes and electrons. The light emitting layer 24g is configured to contain as a main constituent an organic material which produces excitons through recombination of holes and electrons and emits light (hereinafter referred to as "organic light emitting material 24Mg"). In the organic electroluminescent element 12g included in the sub-pixel 12G, the organic light emitting material 24Mg is configured to contain a green organic light emitting material. The organic light emitting material 24Mg as the raw material (material) for the light emitting layer 24g contains a host material and a dopant material. The host material is mainly in charge of the function of transporting electric charges of electrons or holes, while the dopant material is in charge of the function of emitting light. The host material and the dopant material contained in the organic light emitting material 24Mg are each not limited to one kind of material, and may each be a combination of two or more kinds of materials.

As the host material in the light emitting layers 24b2, 24r and 24g, there is used, for example, an amine compound, a condensed polycyclic aromatic compound, or a heterocyclic compound. Examples of the amine compound include monoamine derivatives, diamine derivatives, triamine derivatives, and tetraamine derivatives. Examples of the condensed polycyclic compound include anthracene derivatives, naphthalene derivatives, naphthacene derivatives, phenanthrene derivatives, chrysene derivatives, fluoranthene derivatives, triphenylene derivatives, pentacene derivatives, and perylene derivatives. Examples of the heterocyclic compound include carbazole derivatives, furan derivatives, pyridine derivatives, pyrimidine derivatives, triazine derivatives, imidazole derivatives, pyrazole derivatives, triazole derivatives, oxazole derivatives, oxadiazole derivatives, pyrrole derivatives, indole derivatives, azaindole derivatives, azacarbazole derivatives, pyrazoline derivatives, pyrazolone derivatives, and phthalocyanine derivatives.

In addition, as the dopant material in the light emitting layers 24b2, 24r and 24g, there is used, for example, a pyrene derivative, a fluoranthene derivative, an arylacetylene derivative, a fluorene derivative, a perylene derivative, an oxadiazole derivative, an anthracene derivative, or a chrysene derivative. Besides, as the dopant material in the light emitting layers 24b2, 24r and 24g, a metal complex may be used. Examples of the metal complex include those having a metal atom such as iridium (Ir), platinum (Pt), osmium (Os), gold (Au), rhenium (Re) or ruthenium (Ru) and a ligand.

Production Method

Figure 5:
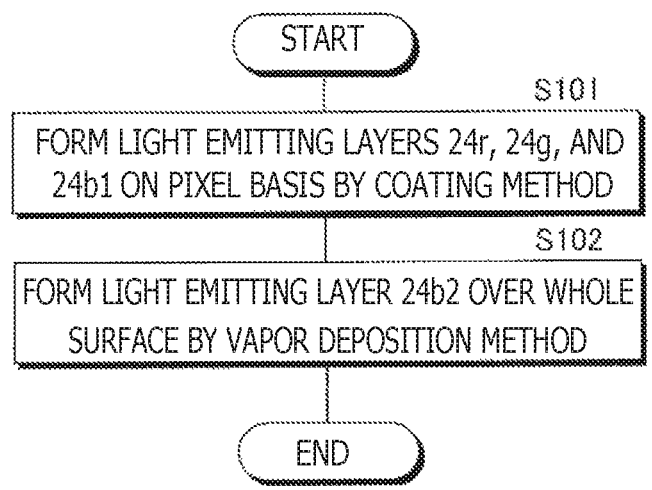
FIG. 5 depicts an example of a procedure of manufacturing the organic electroluminescent panel of FIG. 4.

A method of producing the light emitting layer 24 will be described below. FIG. 5 depicts an example of the procedure for producing the light emitting layer 24. On the anode 21, there are formed the hole injection layer 22 and the hole transport layer 23, by a coating method. The hole injection layer 22 and the hole transport layer 23 have undergone an insolubilizing treatment. First, the light emitting layers 24r, 24g and 24b1 are formed by a coating method, on the basis of the sub-pixels 12R, 12G and 12B (Step 101). For example, on those regions of the hole transport layer 23 which correspond to the sub-pixels 12R, the light emitting layer 24r is formed by a coating method using a solution containing the organic light emitting material 24Mr as a solute. In addition, for example, on those regions of the hole transport layer 23 which correspond to the sub-pixels 12G, the light emitting layer 24g is formed by a coating method using a solution containing the organic light emitting material 24Mg as a solute. Besides, for example, on those regions of the hole transport layer 23 which correspond to the sub-pixels 12B, the light emitting layer 24b1 is formed by a coating method using a solution containing the organic light emitting material 24Mg as a solute.

Next, by a vapor deposition method, the light emitting layer 24b2 is formed over the whole surface (step S102). As a result, the light emitting layer 24R composed of the light emitting layer 24r and the light emitting layer 24b2 is formed, the light emitting layer 24R composed of the light emitting layer 24g and the light emitting layer 24b2 is formed, and the light emitting layer 24B composed of the light emitting layer 24b1 and the light emitting layer 24b2 is formed.

Effects

The advantageous effects of the organic electroluminescent device 1 according to the present embodiment will be described below.

In an organic electroluminescent device of a hybrid type in which coating and vapor deposition are mixedly adopted, light emitting layers for R pixels and G pixels are formed by a coating method, after which a light emitting layer for B pixels is formed over the whole pixel region by a vapor deposition method. In order to form a light emitting layer by the coating method, it is necessary to insolubilize the hole transport layer as a substrate layer for the light emitting layer. For example, by applying a material having a crosslinking property and thereafter causing crosslinking of the material, an insolubilized layer can be formed.

In the hole transport layer having the crosslinking property in this way, energy gap is narrower as compared to a hole transport layer formed by vapor deposition. Therefore, in the case where the hole transport layer for all the pixels is formed in block, the excitons produced in the light emitting layer for the B pixels are deactivated by the hole transport layer, resulting in a lowering in light emission efficiency of the B pixels. For this reason, in the case where it is intended to restrain the lowering in the light emission efficiency of the B pixels, it is necessary, for example, to form only the hole transport layer for the B pixels separately from the hole transport layer for the R pixels and the G pixels. For forming the hole transport layer by a vapor deposition method separately for only the B pixels, however, selective coating by use of a precision mask is indispensable, which is disadvantageous from the viewpoint of process cost.

Meanwhile, in the present embodiment, in the light emitting layer 24B, the light emitting layer 24b1 including a coating film is formed on the hole transport layer 23 side, and the light emitting layer 24b2 including a vapor-deposited film is formed on the electron transport layer 25 side. By this, light emission efficiency of the organic electroluminescent element can be improved, as compared to the case where the light emitting layer 24b2 is in direct contact with the hole transport layer 23.

In addition, in the present embodiment, in the case where the light emitting layer 24b1 and the light emitting layer 24b2 contain a common host material and a common dopant material, deactivation of excitons in the light emitting layer 24B is substantially absent, and, therefore, light emission efficiency of the organic electroluminescent element can be improved.

Besides, in the present embodiment, in the case where the light emitting layer 24b1 does not contain the dopant material and contains the host material which is common to the light emitting layer 24b1 and the light emitting layer 24b2, excitons are not liable to be produced in the light emitting layer 24b1, so that deactivation of excitons at the interface between the light emitting layer 24b1 and the hole transport layer 23 can be restrained. As a result, light emission efficiency of the organic electroluminescent element can be improved.

In addition, in the present embodiment, even in the case where the hole transport layer 23 includes a coating film which has been subjected to an insolubilizing treatment, deactivation of excitons at the interface between the light emitting layer 24B and the hole transport layer 23 can be restrained, since the light emitting layer 24b2 is not in direct contact with the hole transport layer 23. As a result, light emission efficiency of the organic electroluminescent element can be improved.

Besides, in the present embodiment, the light emitting layer 24b2 is formed over the whole surface inclusive of the surfaces of the light emitting layers 24r and 24g. This eliminates the need for selective coating conducted using a precision mask, which is advantageous from the viewpoint of process cost.

2. Modifications

Modification A

Figure 6:
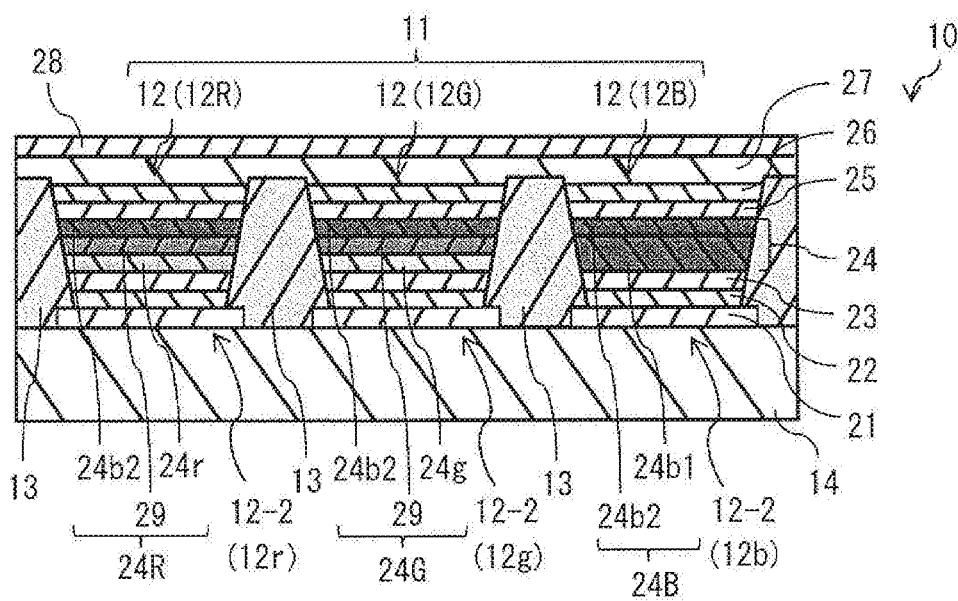
FIG. 6 depicts a modification example of sectional configuration of the organic electroluminescent panel along line A-A of FIG. 3.

In the above-described embodiment, the light emitting layer 24b2 has been formed over the whole surface inclusive of the surfaces of the light emitting layers 24r and 24g. However, a configuration may be adopted in which the light emitting layer 24R has a hole blocking layer 29 between the light emitting layer 24r and the light emitting layer 24b2, and the light emitting layer 24G has a hole blocking layer 29 between the light emitting layer 24g and the light emitting layer 24b2, as depicted in FIG. 6, for example.

The hole blocking layer 29 includes a low-molecular-weight material. The hole blocking layer 29 is for causing triplet excitons formed in the light emitting layers 24r and 24g to be confined in the light emitting layers 24r and 24g, and for restraining efficiency of injection of holes from the light emitting layers 24r and 24g into the light emitting layer 24b2. The triplet energy level of the hole blocking layer 29 is preferably higher than the triplet energy levels of the light emitting layers 24r and 24g. By this, the triplet excitons generated in the light emitting layers 24r and 24g can be prevented from diffusing into the hole blocking layer 29. As a result, light emission efficiency of the organic electroluminescent element can be improved.

Figure 7:
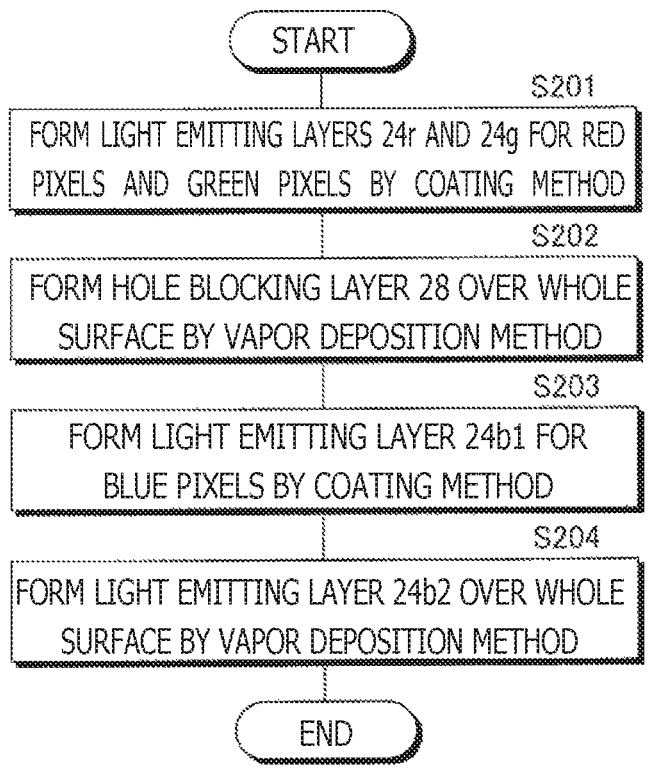
FIG. 7 depicts an example of a procedure of manufacturing the organic electroluminescent panel of FIG. 6.

In the present modification, the light emitting layer 24 is produced, for example, in the following manner. FIG. 7 depicts an example of a procedure for producing the light emitting layer 24 in the present modification. On the anode 21, there are formed the hole injection layer 22 and the hole transport layer 23, by a coating method, like in the above-described embodiment. The hole injection layer 22 and the hole transport layer 23 have been subjected to an insolubilizing treatment.

First, by a coating method, the light emitting layers 24r and 24g are formed for the sub-pixels 12R and 12G (step S201). For example, on those regions of the hole transport layer 23 which correspond to the sub-pixels 12R, the light emitting layer 24r is formed by a coating method using a solution containing the organic light emitting material 24Mr as a solute. In addition, for example, on those regions of the hole transport layer 23 which correspond to the sub-pixels 12G, the light emitting layer 24g is formed by a coating method using a solution containing the organic light emitting material 24Mg as a solute.

Next, by a vapor deposition method, the hole blocking layer 29 is formed on the whole surface (step S202). Subsequently, by a coating method, the light emitting layer 24b1 is formed for the sub-pixels 12B (step S203). In this instance, the hole blocking layer 29 is dissolved by the solution used at the time of forming the light emitting layer 24b1, and the resulting solution makes contact with the hole transport layer 23. Therefore, the light emitting layer 24b1 is formed in the state in which the hole blocking layer 29 is dissolved, whereby the light emitting layer 24b1 can be formed in the state of making contact with the hole transport layer 23.

Next, the light emitting layer 24b2 is formed over the whole surface by a vapor deposition method (step S204). By this, the light emitting layers 24R and 24G including the hole blocking layer 29 are formed, and the light emitting layer 24B including the light emitting layer 24b1 and the light emitting layer 24b2 is formed. In this way, the light emitting layer 24 in the present modification is produced.

According to the aforementioned production method, the light emitting layer 24 can be produced without selective coating by use of a precision mask. Therefore, production of the light emitting layer 24 by use of the aforementioned production method is advantageous from the viewpoint of process cost.

Modification B

Figure 8:
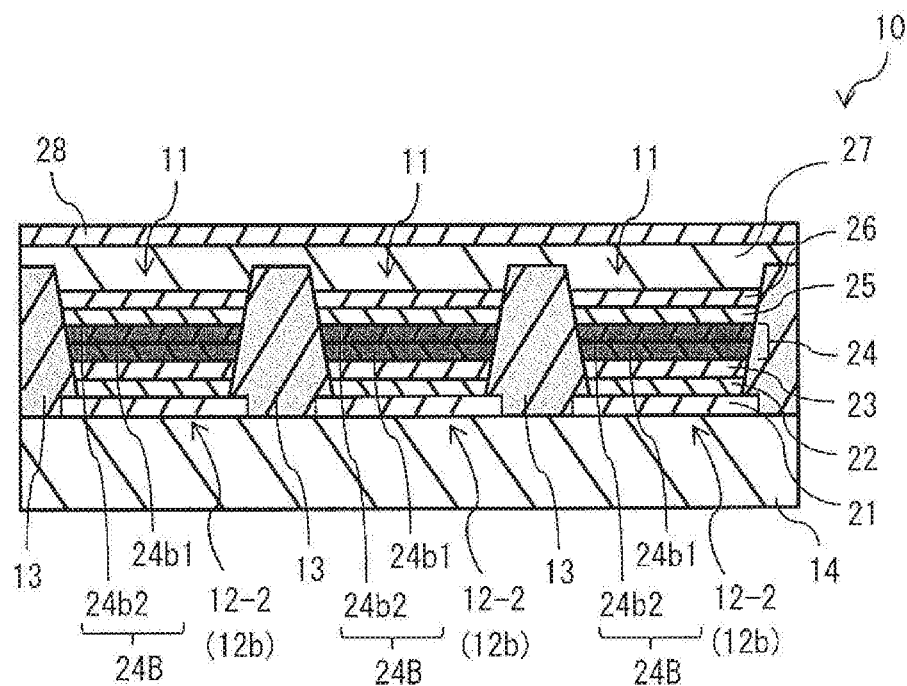
FIG. 8 depicts a modification example of sectional configuration of the organic electroluminescent panel along line A-A of FIG. 3.

While each pixel 11 has included the plurality of sub-pixels 12 in the above-described embodiment, each pixel 11 may include a single pixel. Each pixel 11 may have the same configuration as a sub-pixel 12B, as depicted in FIG. 8, for example.

Modification C

Figure 9:
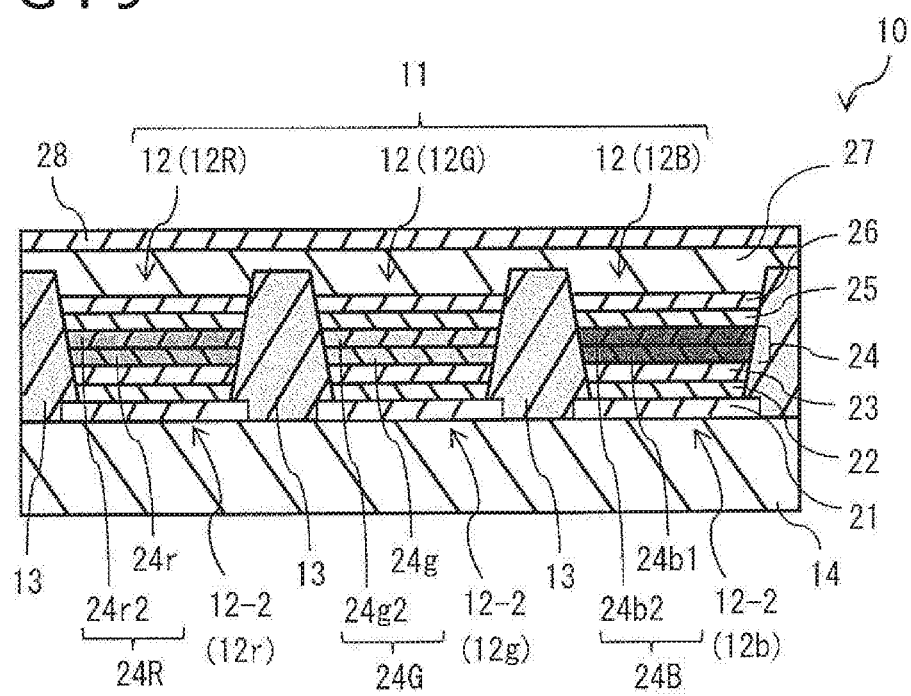
FIG. 9 depicts a modification example of sectional configuration of the organic electroluminescent panel along line A-A of FIG. 3.

In the above-described embodiment, only the sub-pixel 12B has had the light emitting layer 24B which is composed of the light emitting layer 24b1 including a coating film and the light emitting layer 24b2 including a vapor-deposited film. However, the sub-pixel 12R may also be composed of a light emitting layer 24r including a coating film and a light emitting layer 24r2 including a vapor-deposited film, as depicted in FIG. 9, for example. Further, the sub-pixel 12G may also be composed of a light emitting layer 24g including a coating film and a light emitting layer 24g2 including a vapor-deposited film.

3. Application Examples

Application Example 1

An application example of the organic electroluminescent device 1 described in the above embodiment will be described below. The organic electroluminescent device 1 is applicable to display devices of electronic apparatuses in all fields in which a video signal inputted from outside or a video signal produced inside is displayed as an image or a video, such as television sets, digital cameras, notebook type personal computers, sheet-shaped personal computers, portable terminal devices such as mobile phones, and video cameras.

Figure 10:
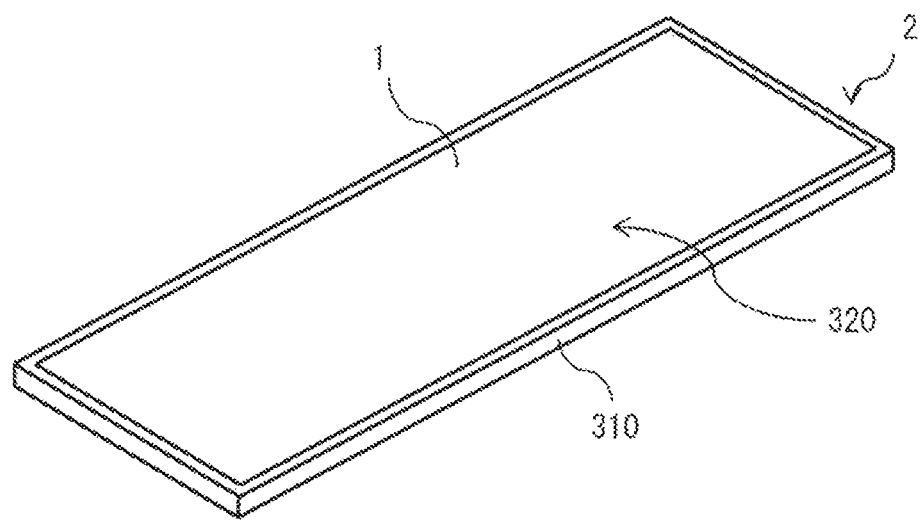
FIG. 10 is a perspective view of an example of appearance of an electronic apparatus provided with an organic electroluminescent device according to one embodiment of the present disclosure.

FIG. 10 is a perspective view of appearance of an electronic apparatus 2 according to the present application example. The electronic apparatus 2 is a sheet-shaped personal computer provided with a display surface 320 at a main surface of a casing 310, for example. The electronic apparatus 2 is provided with an organic electroluminescent device 1 at the display surface 320 of the electronic apparatus 2. The organic electroluminescent device 1 is disposed in such a manner that an organic electroluminescent panel 10 is oriented outward. In the present application example, the organic electroluminescent device 1 is provided at the display surface 320, and, therefore, an electronic apparatus 2 high in light emission efficiency can be realized.

Application Example 2

An application example of the organic electroluminescent element 12-2 described in the above embodiment will be described below. The organic electroluminescent element 12-2 is applicable to light sources of illumination apparatuses in all fields, such as desk or floor type illumination apparatuses and room illumination apparatuses.

Figure 11:
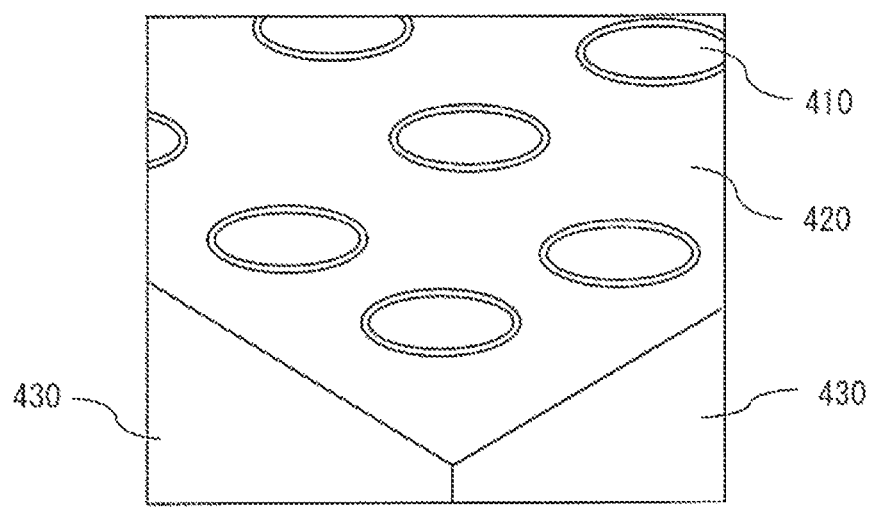
FIG. 11 is a perspective view of an example of appearance of an illumination apparatus provided with an organic electroluminescent element according to one embodiment of the present disclosure.

FIG. 11 depicts appearance of a room illumination apparatus to which the organic electroluminescent element 12-2 is applied. This illumination apparatus has illumination sections 410 including one or a plurality of organic electroluminescent elements 12-2, for example. The illumination sections 410 are disposed in an appropriate number and at appropriate intervals, on a ceiling 420 of a building. Note that depending on use, the illumination section 410 can be disposed in arbitrary places such as a wall 430 or a floor (not depicted), without being limited to the ceiling 420.

In these illumination apparatuses, illumination is conducted by light from the organic electroluminescent elements 12-2. By this, an illumination apparatus with high light emission efficiency can be realized.

While the present disclosure has been described by illustrating the embodiment and application examples hereinabove, the present disclosure is not limited to the embodiment and the like, and various modifications are possible. Note that the effects described herein are mere examples. The effects of the present disclosure are not limited to those described herein. The present disclosure may have other effects than those described herein.

In addition, the present disclosure can have the following configurations, for example.

(1)

An organic electroluminescent element including:

a first electrode, a hole transport layer, a light emitting layer, an electron transport layer and a second electrode in this order, in which the light emitting layer has a first light emitting layer including a coating film on the hole transport layer side, and has a second light emitting layer including a vapor-deposited film on the electron transport layer side.

(2)

The organic electroluminescent element as described in the paragraph (1), in which the first light emitting layer and the second light emitting layer contain a common host material and a common dopant material.

(3)

The organic electroluminescent element as described in the paragraph (1), in which the first light emitting layer does not contain the dopant material, and contains the host material which is common to the first light emitting layer and the second light emitting layer.

(4)

The organic electroluminescent element as described in the paragraph (1), in which the hole transport layer includes a coating film which has been subjected to an insolubilizing treatment.

(5)

An organic electroluminescent panel including:

a plurality of pixels, each of the pixels having a plurality of sub-pixels, each of the sub-pixels having an organic electroluminescent element, in which in at least one of the sub-pixels in each of the pixels, the organic electroluminescent element has a first electrode, a hole transport layer, a light emitting layer, an electron transport layer and a second electrode in this order, and the light emitting layer has a first light emitting layer including a coating film on the hole transport layer side, and has a second light emitting layer including a vapor-deposited film on the electron transport layer side.

(6)

The organic electroluminescent panel as described in the paragraph (5), in which the plurality of sub-pixels include a first sub-pixel adapted to emit red light, a second sub-pixel adapted to emit green light, and a third sub-pixel adapted to emit blue light, the third sub-pixel includes the light emitting layer, the first sub-pixel and the second sub-pixel each have a third light emitting layer including a coating film, and the second light emitting layer is formed on whole surface inclusive of a surface of the third light emitting layer.

(7)

The organic electroluminescent panel as described in the paragraph (5), in which the plurality of sub-pixels include a first sub-pixel adapted to emit red light, a second sub-pixel adapted to emit green light, and a third sub-pixel adapted to emit blue light, the third sub-pixel includes the light emitting layer, the first sub-pixel and the second sub-pixel each have a third light emitting layer including a coating film and a hole blocking layer including a low-molecular-weight material, and the second light emitting layer is formed on a surface inclusive of a surface of the hole blocking layer.

(8)

An organic electroluminescent device including:

an organic electroluminescent panel having a plurality of pixels; and a driving section adapted to drive the plurality of pixels, each of the pixels having a plurality of sub-pixels, each of the sub-pixels having an organic electroluminescent element, in which in at least one of the sub-pixels in each of the pixels, the organic electroluminescent element has a first electrode, a hole transport layer, a light emitting layer, an electron transport layer and a second electrode in this order, and the light emitting layer has a first light emitting layer including a coating film on the hole transport layer side, and has a second light emitting layer including a vapor-deposited film on the electron transport layer side.

(9)

An electronic apparatus including:

an organic electroluminescent device, the organic electroluminescent device including an organic electroluminescent panel having a plurality of pixels, and a driving section adapted to drive the plurality of pixels, each of the pixels having a plurality of sub-pixels,
each of the sub-pixels having an organic electroluminescent element,
in which in at least one of the sub-pixels in each of the pixels, the organic electroluminescent element has a first electrode, a hole transport layer, a light emitting layer, an electron transport layer and a second electrode in this order, and
the light emitting layer has a first light emitting layer including a coating film on the hole transport layer side, and has a second light emitting layer including a vapor-deposited film on the electron transport layer side.

It should be understood by those skilled in the art that various modifications, combinations, sub-combinations and alterations may occur depending on design requirements and other factors insofar as they are within the scope of the appended claims or the equivalents thereof.

What is claimed is:
1. An organic electroluminescent panel, comprising:
a plurality of pixels, wherein
each pixel of the plurality of pixels has a plurality of sub-pixels,
each sub-pixel of the plurality of sub-pixels has an organic electroluminescent element,
the organic electroluminescent element comprises:
a first electrode;
a hole transport layer;
a first light emitting layer that comprises:
a second light emitting layer, and
a third light emitting layer;
an electron transport layer; and
a second electrode, wherein
the first light emitting layer is a hybrid of the second light emitting layer on the third light emitting layer,
the second light emitting layer is a first coating film on a hole transport layer side of the first light emitting layer, and
the third light emitting layer is a first vapor-deposited film on an electron transport layer side of the first light emitting layer
the plurality of sub-pixels includes a first sub-pixel adapted to emit red light, a second sub-pixel adapted to emit green light, and a third sub-pixel adapted to emit blue light,
the third sub-pixel includes the first light emitting layer,
each of the first sub-pixel and the second sub-pixel have a fourth light emitting layer including a third coating film, and
the third light emitting layer is over whole surface of the fourth light emitting layer.

2. The organic electroluminescent panel according to claim 1,
wherein each of the second light emitting layer and the third light emitting layer contains a common host material and a common dopant material.

3. The organic electroluminescent panel according to claim 1,
wherein the second light emitting layer does not contain a dopant material but contains a host material which is common to the second light emitting layer and the third light emitting layer.

4. The organic electroluminescent panel according to claim 1, wherein
the hole transport layer is a second coating film, and the second coating film is subjected to an insolubilizing treatment.

5. The organic electroluminescent panel according to claim 1, wherein
the hole transport layer is a second coating film, and
the electron transport layer is second vapor-deposited film.

6. An organic electroluminescent panel, comprising:
a plurality of pixels, wherein
each pixel of the plurality of pixels has a plurality of sub-pixels,
each sub-pixel of the plurality of sub-pixels has an organic electroluminescent element,
the organic electroluminescent element comprises:
a first electrode;
a hole transport layer;
a first light emitting layer that comprises:
a second light emitting layer; and
a third light emitting layer;
an electron transport layer; and
a second electrode;
the first light emitting layer is a hybrid of the second light emitting layer on the third light emitting layer,
the second light emitting layer is a first coating film on a hole transport layer side of the first light emitting layer,
the third light emitting layer is a first vapor-deposited film on an electron transport layer side of the first light emitting layer,
the plurality of sub-pixels includes a first sub-pixel adapted to emit red light, a second sub-pixel adapted to emit green light, and a third sub-pixel adapted to emit blue light,
the third sub-pixel includes the first light emitting layer,
each of the first sub-pixel and the second sub-pixel have a fourth light emitting layer including a third coating film and a hole blocking layer,
the hole blocking layer includes a low-molecular-weight material, and
the third light emitting layer is over a surface of the hole blocking layer.

7. An organic electroluminescent device, comprising:
an organic electroluminescent panel having a plurality of pixels; and
a driving section adapted to drive the plurality of pixels, wherein
each pixel of the plurality of pixels have a plurality of sub-pixels,
each sub-pixel of the plurality of sub-pixels have an organic electroluminescent element,
the organic electroluminescent element comprises:
a first electrode;
a hole transport layer;
a first light emitting layer that comprises:
a second light emitting layer; and
a third light emitting layer;
an electron transport layer; and
a second electrode;
the first light emitting layer is a hybrid of the second light emitting layer on the third light emitting layer,
the second light emitting layer is a first coating film on a hole transport layer side of the first light emitting layer,
the third light emitting layer is a first vapor-deposited film on an electron transport layer side of the first light emitting layer, the plurality of sub-pixels includes a first sub-pixel adapted to emit red light, a second sub-pixel adapted to emit green light, and a third sub-pixel adapted to emit blue light, the third sub-pixel includes the first light emitting layer, each of the first sub-pixel and the second sub-pixel have a fourth light emitting layer including a third coating film, and the third light emitting layer is over whole surface of the fourth light emitting layer.

8. An electronic apparatus, comprising:
an organic electroluminescent device, including:
   an organic electroluminescent panel having a plurality of pixels; and
   a driving section adapted to drive the plurality of pixels, wherein
     each pixel of the plurality of pixels has a plurality of sub-pixels,
     each sub-pixel of the plurality of sub-pixels has an organic electroluminescent element,
     the organic electroluminescent element comprises:
       a first electrode;
       a hole transport layer;
       a first light emitting layer that comprises:
       a second light emitting layer; and
       a third light emitting layer;
       an electron transport layer; and
       a second electrode;

the first light emitting layer is a hybrid of the second light emitting layer on the third light emitting layer, the second light emitting layer is a first coating film on a hole transport layer side of the first light emitting layer, the third light emitting layer is a first vapor-deposited film on an electron transport layer side of the first light emitting layer, the plurality of sub-pixels includes a first sub-pixel adapted to emit red light, a second sub-pixel adapted to emit green light, and a third sub-pixel adapted to emit blue light, the third sub-pixel includes the first light emitting layer, each of the first sub-pixel and the second sub-pixel have a fourth light emitting layer including a third coating film, and the third light emitting layer is over whole surface of the fourth light emitting layer.

* * * * *